(12) United States Patent
Matsumoto

(10) Patent No.: US 7,019,729 B2
(45) Date of Patent: Mar. 28, 2006

(54) DRIVING CIRCUIT AND DISPLAY COMPRISING THE SAME

(75) Inventor: Shoichiro Matsumoto, Ogaki (JP)

(73) Assignee: Sanyo Eleectric Co., Ltd., Osaka (JP)

( * ) Notice: Subject to any disclaimer, the term of this patent is extended or adjusted under 35 U.S.C. 154(b) by 365 days.

(21) Appl. No.: 10/151,944

(22) Filed: May 22, 2002

(65) Prior Publication Data

US 2002/0175904 A1   Nov. 28, 2002

(30) Foreign Application Priority Data

May 24, 2001   (JP)   ............................. 2001-155465

(51) Int. Cl.
*G09G 3/36*   (2006.01)
(52) U.S. Cl. ..................... 345/98; 345/209; 327/563
(58) Field of Classification Search .......... 345/98–100, 345/204, 209; 327/563; 330/277, 296, 2
See application file for complete search history.

(56) References Cited

U.S. PATENT DOCUMENTS

| | | | | |
|---|---|---|---|---|
| 5,352,935 | A | * | 10/1994 | Yamamura et al. .......... 327/540 |
| 5,801,564 | A | * | 9/1998 | Gasparik ..................... 327/170 |
| 6,184,855 | B1 | * | 2/2001 | Kobayashi et al. .......... 345/100 |
| 6,297,596 | B1 | | 10/2001 | Kajihara |
| 6,456,155 | B1 | * | 9/2002 | Takai .......................... 327/541 |

FOREIGN PATENT DOCUMENTS

| | | | |
|---|---|---|---|
| JP | 09230829 A | * | 9/1997 |
| JP | 11-259052 | | 9/1999 |
| JP | 2001-042830 A | | 2/2001 |

OTHER PUBLICATIONS

"12.2: A Low-Power Data Driver for TFT-LCDs", Y.C. Sung et al., SID 00 Digest, pp. 142-145, ISSN0000-0966X/00/3101-0142.
Office Action (Decision of Rejection) for corresponding Japanese Patent Application No. JP 2001-155456 dispatched Sep. 21, 2005.

* cited by examiner

*Primary Examiner*—Alexander Eisen
(74) *Attorney, Agent, or Firm*—McDermott Will & Emery LLP

(57) ABSTRACT

A driving circuit capable of implementing voltage reduction and attaining high-speed operation and high precision while controlling currents consumed by two through current control transistors independently of each other is obtained. This driving circuit comprises a first differential circuit including a first through current control transistor, a second differential circuit including a second through current control transistor and an output circuit including a first conductivity type first output transistor having a gate supplied with an output of the first differential circuit and a second conductivity type second output transistor having a gate supplied with an output of the second differential circuit. A first potential is supplied to the gate of the first through current control transistor of the first differential circuit while a second potential is supplied to the gate of the second through current control transistor of the second differential circuit.

9 Claims, 10 Drawing Sheets

DRIVING CIRCUIT AND DISPLAY COMPRISING THE SAME

BACKGROUND OF THE INVENTION

1. Field of the Invention

The present invention relates to a driving circuit and a display comprising the same, and more particularly, it relates to a driving circuit having a differential circuit and a display comprising the same.

2. Description of the Background Art

A driving circuit having a differential circuit is known in general. Such a driving circuit is employed for writing analog data in data lines of a pixel part in a display such as a liquid crystal display (LCD) or an organic EL (electroluminescence) display, for example. Throughout the specification, the display is described with reference to a liquid crystal display (LCD).

Demand for a miniature LCD employing polysilicon TFTs (thin film transistors) is recently increased. Following this, reduction of power consumption in a display system including an LCD panel and n external control IC and implementation of a digital interface corresponding to digitization of a peripheral device are strongly required.

In particular, digitization of a video signal is highly required. In order to digitize a video signal, a DAC (digital-to-analog converter) circuit converting the digital video signal to an analog video signal must be built into the panel. It is known that a circuit for driving data lines when writing analog data converted from digital data by the DAC circuit is provided.

FIG. 10 is a circuit diagram showing a conventional push-pull differential amplification circuit driving a TFT-LCD panel disclosed in Y. C. Sung et. al., "A Low-Power Data Driver for TFT-LCDs", SID Digest 12.2 (2000), pp. 142–145.

The conventional push-pull differential amplification circuit shown in FIG. 10 comprises a differential circuit 101, a voltage level shifting circuit 102 and a push-pull output circuit 103. The differential circuit 101 includes a p-channel transistor 113 having a gate supplied with an input in and a p-channel transistor 112 having a gate supplied with an output OUT.

The voltage level shifting circuit 102 has a circuit structure formed by parallel-connecting a p-channel transistor MP1 and an n-channel transistor MN1 to an intermediate portion of a current mirror circuit.

The push-pull output circuit 103 includes a p-channel transistor 131 and an n-channel transistor 132. Nodes VGP and VGN of the voltage level shifting circuit 102 are connected to the gates of the p-channel transistor 131 and the n-channel transistor 132 respectively.

The p-channel transistors 112 and 113 of the differential circuit 101 are connected to a node VO and the node VGN of the voltage level shifting circuit 102 respectively.

In schematic operation of the conventional push-pull differential amplification circuit having the aforementioned structure, the potentials of the nodes VGN and VO are set to the same value when there is no potential difference between the input in and the output OUT.

In a stationary state, mirror currents I1 and I2 regularly flow in the voltage level shifting circuit 102 thereby setting the potentials of the nodes VNG and VGP. When potential difference is caused between the input in and the output OUT, a signal is transmitted to the node VGN or VO thereby causing potential difference between the nodes VGN and VO. The voltage level shifting circuit 102 operates to eliminate the potential difference between the nodes VGN and VO, i.e., to equalize the mirror currents I1 and I2 with each other. Consequently, both of the nodes VGN and VGP are level-shifted to a higher or lower potential side. The push-pull output circuit 103 outputs a signal potential responsive to the potential fluctuation of the nodes VGN and VGP resulting from the operation of the voltage level shifting circuit 103 to an output terminal OUT.

When the output potential OUT is higher than an input potential Vin, the push-pull differential amplification circuit operates to turn off the p-channel transistor 131 of the push-pull output circuit 103 while turning on the n-channel transistor 132 of the push-pull output circuit 103, thereby pulling down the output potential OUT. When the output potential OUT is lower than the input potential Vin, the push-pull differential amplification circuit operates to turn on the p-channel transistor 131 of the push-pull output circuit 103 while turning off the n-channel transistor 132 of the push-pull output circuit 103, thereby pulling up the output potential OUT. In other words, the push-pull differential amplification circuit operates to equalize the input potential Vin and the output potential OUT with each other.

Thus, the conventional push-pull differential amplification circuit operates to reduce the difference between the input potential Vin and the output potential OUT while comparing the same with each other.

In the aforementioned conventional push-pull differential amplification circuit, a bias potential Bias is applied to the gates of the p-channel transistor MP1 and the n-channel transistor MN1 of the voltage level shifting circuit 102 in order to reduce power consumption in the circuit operation, thereby reducing the quantities of the mirror currents I1 and I2 and attaining low power consumption.

In general, the bias potential Bias is set to a level between power supply voltages VDD and VSS (GND). In the conventional circuit shown in FIG. 10, therefore, the bias potential Bias is conceivably set between the potentials of the nodes VGP and VGN. This is because the mirror currents I1 and I2 must be fed by setting the bias potential Bias to the level between the potentials of the nodes VGP and VGN, which is higher than the threshold voltages of the p-channel transistor MP1 and the n-channel transistor MN1, for necessarily turning on the p-channel transistor MP1 and the n-channel transistor MN1 in order to operate the voltage level shifting circuit 102.

Consider a stationary state where the mirror currents I1 and I2 are balanced with each other (the voltages OUT and in are balanced with each other). At this time, the potential of the node VGP is necessarily lower than the threshold voltage of a p-channel transistor connected to the power supply voltage VDD, while the potential of the node VGN is necessarily higher than the threshold voltage of an n-channel transistor connected to the power supply voltage VSS. In this state, both of the p-channel transistor 131 and the n-channel transistor 132 of the push-pull output circuit 103 are ON followed by through currents. It is understood that this relation between the voltage level shifting circuit 102 and the push-pull output circuit 103 is therefore unsuitable for reduction of current consumption. In order to implement low current consumption in this circuit structure, current drivability of the p-channel transistor 131 and the n-channel transistor 132 of the push-pull output circuit 103 may be reduced. In this case, however, drivability for serving as an output stage is reduced, leading to a problem in high-speed operation. In the structures of the voltage level shifting circuit 102 and the push-pull output circuit 103 of the conventional push-pull differential amplification circuit shown in FIG. 10, therefore, it is difficult to reduce current consumption.

In order to feed the mirror currents I1 and I2 in the conventional voltage level shifting circuit 102 shown in FIG. 10, the power supply voltage VDD must satisfy the following inequality:

$$VDD>2(Vtp+Vtn) \quad (1)$$

where Vtp and Vtn represent the threshold voltages of the p-channel transistor MP1 and the n-channel transistor MN1 respectively. When the conventional push-pull differential amplification circuit shown in FIG. 10 is designed with thin film transistors having high threshold voltages with large dispersion in fabrication, the power supply voltage VDD must be set high due to the limitation of the inequality (1). Consequently, it is disadvantageously difficult to lower the power supply voltage VDD.

In the voltage level shifting circuit 102 of the conventional push-pull differential amplification circuit, further, the power supply voltage VDD is influenced by the threshold voltages of two n-channel transistors and two p-channel transistors, i.e., four transistors in total as shown in the above inequality (1). When the potentials of the nodes VGP and VGN of the voltage level shifting circuit 102 are supplied to the gates of the p-channel transistor 131 and the n-channel transistor 132 of the push-pull output circuit 103 respectively, therefore, the voltage ranges available for the gates of the p-channel transistor 131 and the n-channel transistor 132 are disadvantageously reduced. Therefore, the operating ranges of the p-channel transistor 131 and the n-channel transistor 132 are also reduced, and hence it is difficult to strongly and quickly turn on the p-channel transistor 131 and the n-channel transistor 132 for improving response characteristics. Consequently, the output value of the push-pull output circuit 103 is unstabilized by overshooting or undershooting, and hence it is difficult to improve the precision of the output value. In addition, it takes time to converge the output value, and hence it is also difficult to increase the operating speed.

In general, the operating ranges of the p-channel transistor 131 and the n-channel transistor 132 must be widened in order to prevent such disadvantages, and hence the voltage ranges available for the gates of the p-channel transistor 131 and the n-channel transistor 132 must be widened by increasing the power supply voltage VDD. In the conventional push-pull differential amplification circuit, therefore, it is difficult to implement voltage reduction.

SUMMARY OF THE INVENTION

An object of the present invention is to provide a driving circuit capable of attaining a wide operating range also when a power supply voltage is small, for implementing voltage reduction.

Another object of the present invention is to increase the operating speed and improve precision by preventing an output value from overshooting or undershooting in the aforementioned driving circuit.

Still another object of the present invention is to provide a display capable of implementing voltage reduction while increasing the speed of data write operation and improving precision of the data write operation.

In order to attain the aforementioned objects, a driving circuit according to a first aspect of the present invention comprises a first differential circuit, connected between a first voltage source and a second voltage source, receiving a prescribed reference voltage and including a first through current control transistor, a second differential circuit, connected between the first voltage source and the second voltage source, receiving the prescribed reference voltage and including a second through current control transistor and an output circuit including a first conductivity type first output transistor having a gate supplied with an output of the first differential circuit and a second conductivity type second output transistor having a gate supplied with an output of the second differential circuit. A first potential is supplied to the gate of the first through current control transistor of the first differential circuit while a second potential is supplied to the gate of the second through current control transistor of the second differential circuit.

The driving circuit according to the first aspect supplies the outputs of the first and second differential circuits to the gates of the first and second output transistors of the output circuit respectively as described above, whereby the gates of the first and second output transistors can be driven independently of each other. When the first and second differential circuits are formed by current mirror circuits, for example, the first and second differential circuits are influenced only by the threshold voltages of single transistors respectively. Therefore, voltage ranges available for the first and second differential circuits can be widened, whereby the ranges of voltages applied to the gates of the first and second output transistors can be widened. Also when the voltage (power supply voltage) of the first voltage source is small, therefore, the first and second output transistors can have wide operating ranges, to be capable of implementing voltage reduction. Further, the first and second output transistors capable of having wide operating ranges can be strongly and quickly turned on. Thus, the operating speed can be increased and an output value is quickly converged, whereby the output value can be inhibited from overshooting or undershooting. Consequently, precision of data can be improved. In addition, the first and second potentials are supplied to the gates of the first and second through current control transistors of the first and second differential circuits respectively, whereby currents consumed by the first and second through current control transistors can be controlled independently of each other.

In the aforementioned driving circuit according to the first aspect, the potential of a prescribed node of the second differential circuit is preferably supplied to the gate of the first through current control transistor of the first differential circuit, and a prescribed bias potential is preferably supplied to the gate of the second through current control transistor of the second differential circuit. According to this structure, the currents consumed by the first and second through current control transistors can be controlled independently of each other by providing only a single bias power source.

In the aforementioned driving circuit according to the first aspect, a prescribed bias potential is preferably supplied to the gate of the first through current control transistor of the first differential circuit, and the potential of a prescribed node of the first differential circuit is preferably supplied to the gate of the second through current control transistor of the second differential circuit. According to this structure, the currents consumed by the first and second through current control transistors can be controlled independently of each other by providing only a single bias power source. In this case, the bias potential supplied to the gate of the first through current control transistor of the first differential circuit is preferably a ground potential. According to this structure, the currents consumed by the first and second through current control transistors can be controlled independently of each other without providing a bias power source.

In the aforementioned driving circuit according to the first aspect, the potential of a prescribed node of the second differential circuit is preferably supplied to the gate of the first through current control transistor of the first differential circuit, and the potential of a prescribed node of the first differential circuit is preferably supplied to the gate of the second through current control transistor of the second differential circuit. According to this structure, the currents consumed by the first and second through current control transistors can be controlled independently of each other without providing a bias power source.

In the aforementioned driving circuit according to the first aspect, a first bias potential may be supplied to the gate of the first through current control transistor of the first differential circuit, and a second bias potential may be supplied to the gate of the second through current control transistor of the second differential circuit. According to this structure, the currents consumed by the first and second through current control transistors can be controlled independently of each other. In this case, the first bias potential preferably includes a first video signal potential, and the second bias potential preferably includes a second video signal potential. According to this structure, the currents consumed by the first and second through current control transistors can be controlled independently of each other without providing a specific bias power source. In this case, further, the first video signal potential and the second video signal potential may include the same video signal potential.

In the aforementioned driving circuit according to the first aspect, the first differential circuit may include a first differential amplifier, the second differential circuit may include a second differential amplifier, the first through current control transistor may include a first n-channel transistor connected to a low voltage side of the first differential amplifier, and the second through current control transistor may include a first p-channel transistor connected to a high voltage side of the second differential amplifier.

In the aforementioned driving circuit according to the first aspect, the first differential circuit preferably includes a first switching transistor, the second differential circuit preferably includes a second switching transistor, and the driving circuit preferably further comprises a starting control circuit activating the first switching transistor of the first differential circuit, the second switching transistor of the second differential circuit and the first and second output transistors of the output circuit while generating a signal for the activation. According to this structure, the starting control circuit can be employed for operating first and second differential circuits and the output circuit only when necessary. Thus, current consumption can be further reduced. In this case, the first differential circuit may include a first differential amplifier, the second differential circuit may include a second differential amplifier, the first switching transistor may include a second n-channel transistor connected to a low voltage side of the first differential amplifier, and the second switching transistor may include a second p-channel transistor connected to a high voltage side of the second differential amplifier.

In this case, further, the starting control circuit may include a third p-channel transistor connected to an output of the first differential circuit, a third n-channel transistor connected to an output of the second differential circuit and an inverter circuit for supplying an inverted signal to the gates of the second p-channel transistor and the third n-channel transistor. According to this structure, the starting control circuit can be employed for readily operating the first and second differential circuits and the output circuit only when necessary.

In the aforementioned driving circuit having the starting control circuit, the starting control circuit preferably generates the signal for the activation in synchronization with a write signal supplying data to a data line. According to this structure, the starting control circuit can be employed for operating the first and second differential circuits only in data writing.

In the aforementioned driving circuit according to the first aspect, a single driving circuit including the first differential circuit, the second differential circuit and the output circuit is preferably provided for a plurality of data lines. According to this structure, the occupation area of the driving circuit as well as the number of elements can be reduced. Thus, power consumption can be further reduced.

A display according to a second aspect of the present invention comprises a driving circuit and a pixel part connected to a data line, while the driving circuit includes a first differential circuit, connected between a first voltage source and a second voltage source, receiving a prescribed reference voltage and including a first through current control transistor, a second differential circuit, connected between the first voltage source and the second voltage source, receiving the prescribed reference voltage and including a second through current control transistor, and an output circuit including a first conductivity type first output transistor having a gate supplied with an output of the first differential circuit and a second conductivity type second output transistor having a gate supplied with an output of the second differential circuit. A first potential is supplied to the gate of the first through current control transistor of the first differential circuit while a second potential is supplied to the gate of the second through current control transistor of the second differential circuit.

The display according to the second aspect supplies the outputs of the first and second differential circuits to the gates of the first and second output transistors of the output circuit respectively as described above, whereby the gates of the first and second output transistors can be driven independently of each other. When the first and second differential circuits are formed by current mirror circuits, for example, the first and second differential circuits are influenced only by the threshold voltages of single transistors respectively. Therefore, voltage ranges available for the first and second differential circuits can be widened, whereby the ranges of voltages applied to the gates of the first and second output transistors can be widened. Also when the voltage (power supply voltage) of the first voltage source is small, therefore, the first and second output transistors can have wide operating ranges, to be capable of implementing voltage reduction. Further, the first and second output transistors capable of having wide operating ranges can be strongly and quickly turned on. Thus, the operating speed can be increased and an output value is quickly converged, whereby the output value can be inhibited from overshooting or undershooting. Consequently, precision of data can be improved. Therefore, a display capable of implementing voltage reduction and improving the speed and precision of data writing can be provided. In addition, the first and second potentials are supplied to the gates of the first and second through current control transistors of the first and second differential circuits respectively, whereby currents consumed by the first and second through current control transistors can be controlled independently of each other.

In the aforementioned display according to the second aspect, the potential of a prescribed node of the second differential circuit is preferably supplied to the gate of the first through current control transistor of the first differential circuit, and a prescribed bias potential is preferably supplied to the gate of the second through current control transistor of the second differential circuit. According to this structure, the currents consumed by the first and second through current control transistors can be controlled independently of each other by providing only a single bias power source.

In the aforementioned display according to the second aspect, a prescribed bias potential is preferably supplied to the gate of the first through current control transistor of the first differential circuit, and the potential of a prescribed node of the first differential circuit is preferably supplied to the gate of the second through current control transistor of the second differential circuit. According to this structure, the currents consumed by the first and second through current control transistors can be controlled independently of each other by providing only a single bias power source.

In the aforementioned display according to the second aspect, the potential of a prescribed node of the second differential circuit is preferably supplied to the gate of the first through current control transistor of the first differential circuit, and the potential of a prescribed node of the first differential circuit is preferably supplied to the gate of the second through current control transistor of the second differential circuit. According to this structure, the currents consumed by the first and second through current control transistors can be controlled independently of each other without providing a bias power source.

In the aforementioned display according to the second aspect, the first differential circuit preferably includes a first switching transistor, the second differential circuit preferably includes a second switching transistor, and the driving circuit preferably further comprises a starting control circuit activating the first switching transistor of the first differential circuit, the second switching transistor of the second differential circuit and the first and second output transistors of the output circuit while generating a signal for the activation. According to this structure, the starting control circuit can be employed for operating the first and second differential circuits and the output circuit only when necessary. Thus, current consumption can be further reduced. In this case, the starting control circuit preferably generates the signal for the activation in synchronization with a write signal supplying data to a data line. According to this structure, the starting control circuit can be employed for operating the first and second differential circuits only in data writing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
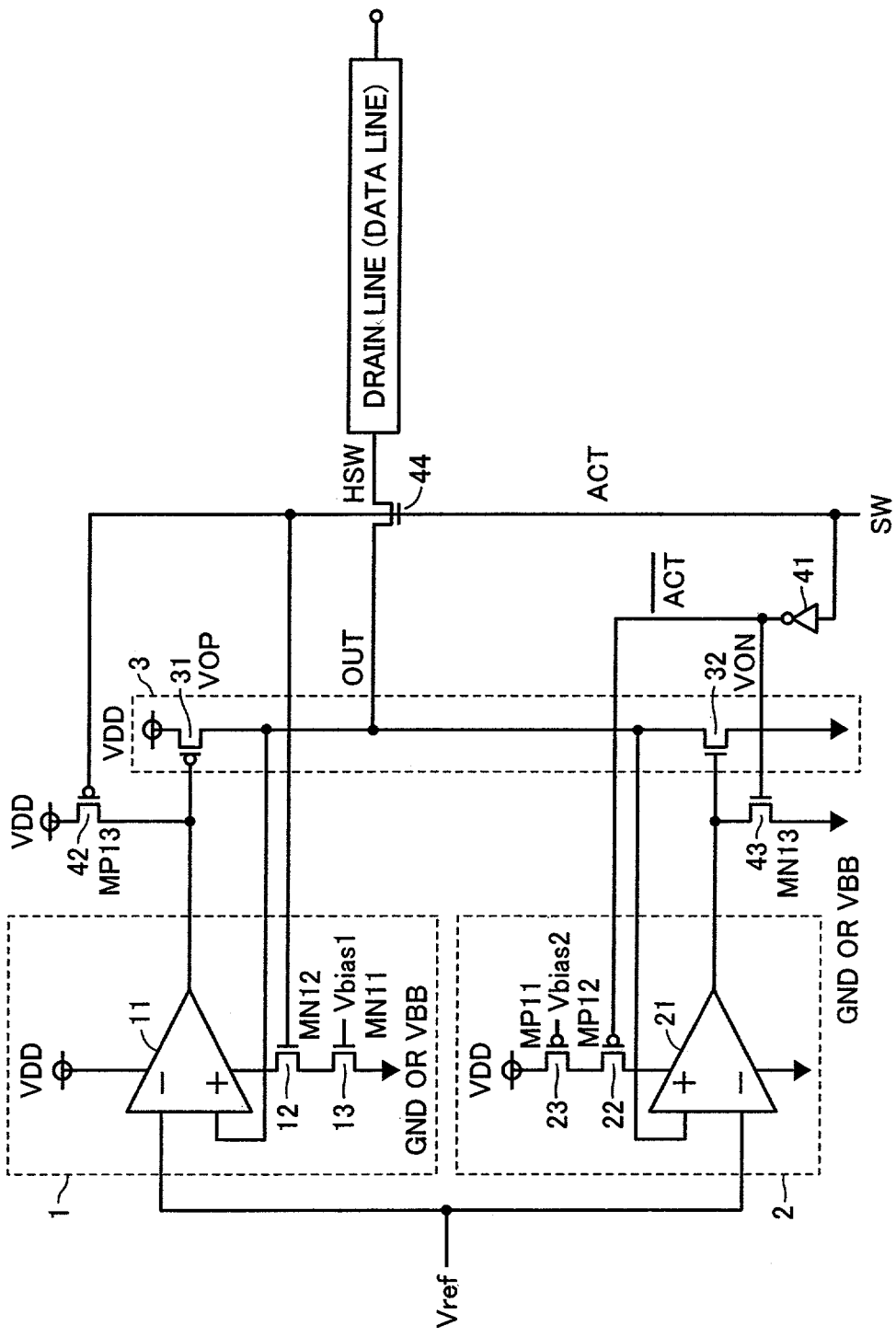
FIG. 1 is a circuit diagram showing a driving circuit including an analog buffer circuit according to a first embodiment of the present invention.

Referring to FIG. 1, a driving circuit (analog buffer circuit) according to a first embodiment of the present invention comprises a first differential circuit 1, a second differential circuit 2 and a push-pull output circuit 3. The push-pull output circuit 3 is an example of the "output circuit" according to the present invention.

The first differential circuit 1 includes a differential amplifier 11, a switching n-channel transistor (MN12) 12 and a through current control n-channel transistor (MN11) 13. The n-channel transistors 12 and 13 are connected to a low voltage side of the differential amplifier 11. The n-channel transistor (MN12) 12 is an example of the "first switching transistor" according to the present invention, and the n-channel transistor (MN11) 13 is an example of the "first through current control transistor" according to the present invention.

The second differential circuit 2 includes a differential amplifier 21, a switching p-channel transistor (MP12) 22 and a through current control p-channel transistor (MP11) 23. The p-channel transistors 22 and 23 are connected to a power supply voltage (VDD) side of the differential amplifier 21. The p-channel transistor (MP12) 22 is an example of the "second switching transistor" according to the present invention, and the p-channel transistor (MP11) 23 is an example of the "second through current control transistor" according to the present invention.

A bias potential Vbias1 is connected to the through current control n-channel transistor 13 of the first differential circuit 1, and a bias potential Vbias2 is connected to the through current control p-channel transistor 23 of the second differential circuit 2. The push-pull output circuit 3 includes a p-channel transistor 31 and an n-channel transistor 32. The p-channel transistor 31 is an example of the "first output transistor" according to the present invention, and the n-channel transistor 32 is an example of the "second output transistor" according to the present invention.

A reference potential Vref is input in inversion input terminals of the differential amplifiers 11 and 21 of the first and second differential circuits 1 and 2. An output potential OUT is input in non-inversion input terminals of the differential amplifiers 11 and 21.

According to the first embodiment, an output of the first differential circuit 1 is input in the gate of the p-channel transistor 31 of the push-pull output circuit 3. An output of the second differential circuit 2 is input in the gate of the n-channel transistor 32 of the push-pull output circuit 3.

The power supply potential VDD is connected to the output of the first differential circuit 1 through a p-channel transistor (MP13) 42. A ground potential GND or a negative potential VBB is connected to the output of the second differential circuit 2 through an n-channel transistor (MN13) 43. An inverter circuit 41 for inverting a data write signal SW is connected between the p-channel transistor 42 and a generation source (not shown) for the data write signal SW. A write control n-channel transistor (HSW) 44 is connected between an output terminal OUT of the push-pull output circuit 3 and a drain line (data line). The drain line (data line) is a data write line for writing video data in a pixel part (not shown). The n-channel transistor (HSW) 44 is a switching transistor allowing the operation of writing the video data in the pixel part.

In operation of the driving circuit according to the first embodiment, the data write signal SW goes high for generating start signals ACT and /ACT and activating the first and second differential circuits 1 and 2 and the push-pull output circuit 3 while the write control n-channel transistor (HSW) 44 is simultaneously turned on for starting writing video data. In other words, the first and second differential circuits 1 and 2 and the push-pull output circuit 3 are activated in synchronization with the data write signal SW for the video data. The inverter circuit 41, the p-channel transistor 42 and the n-channel transistor 43 form a starting control circuit for starting the first and second differential circuits 1 and 2 and the push-pull output circuit 3 and generating the start signals ACT and /ACT.

When this starting control circuit activates the first and second differential circuits 1 and 2 and the push-pull output circuit 3, the input reference potential Vref and the output potential OUT are compared with each other. If the output potential OUT is higher than the input reference potential Vref, the first differential circuit 1 operates to turn off the p-channel transistor (VOP) 31 of the push-pull output circuit 3 while the second differential circuit 2 operates to turn on the n-channel transistor (VON) 32 of the push-pull output circuit 3. Thus, the output potential OUT is pulled down.

If the output potential OUT is lower than the input reference potential Vref, the first differential circuit 1 operates to turn on the p-channel transistor (VOP) 31 of the push-pull output circuit 3 while the second differential circuit 2 operates to turn off the n-channel transistor (VON) 32 of the push-pull output circuit 3. Thus, the output potential OUT is pulled up.

Thus, the analog buffer circuit according to the first embodiment operates to equalize the input reference potential Vref and the output potential OUT with each other.

According to the first embodiment, the outputs of the first and second differential circuits 1 an 2 are supplied to the gates of the p-channel transistor 31 and the n-channel transistor 32 of the push-pull output circuit 3 respectively as described above, whereby the gates of the p-channel transistor 31 and the n-channel transistor 32 can be driven independently of each other. When the first and second differential circuits 1 and 2 are formed by current mirror circuits in this case, for example, the first and second differential circuits 1 and 2 are influenced by only the threshold voltages of single transistors respectively. Therefore, the voltage ranges available for the first and second differential circuits 1 and 2 can be widened, whereby the ranges of voltages applied to the gates of the p-channel transistor 31 and the n-channel transistor 32 can be widened. Also when the power supply voltage VDD is small, therefore, the operating ranges of the gates of the p-channel transistor 31 and the n-channel transistor 32 can be widened. Consequently, voltage reduction can be implemented.

Further, the gates of the p-channel transistor 31 and the n-channel transistor 32 capable of having wide operating ranges can be strongly and quickly turned on. Thus, the speed for the write operation can be increased while an output value is quickly converged. Consequently, the output value (data) can be prevented from overshooting or undershooting, for improving precision of the data.

According to the first embodiment, the starting control circuit can be employed for operating first and second differential circuits 1 and 2 and the push-pull output circuit 3 only in writing, whereby current consumption can be further reduced.

According to the first embodiment, further, the bias potentials Vbias1 and Vbias2 are connected to the gates of the through current n-channel transistor 13 of the first differential circuit 1 and the through current control p-channel transistor 23 of the second differential circuit 2 respectively, so that the gate potentials of the n-channel transistor 13 and the p-channel transistor 23 can be controlled independently of each other. Consequently, currents consumed by the first and second differential circuits 1 and 2 can be readily controlled independently of each other, whereby current consumption can be reduced.

(Second Embodiment)

Figure 2:
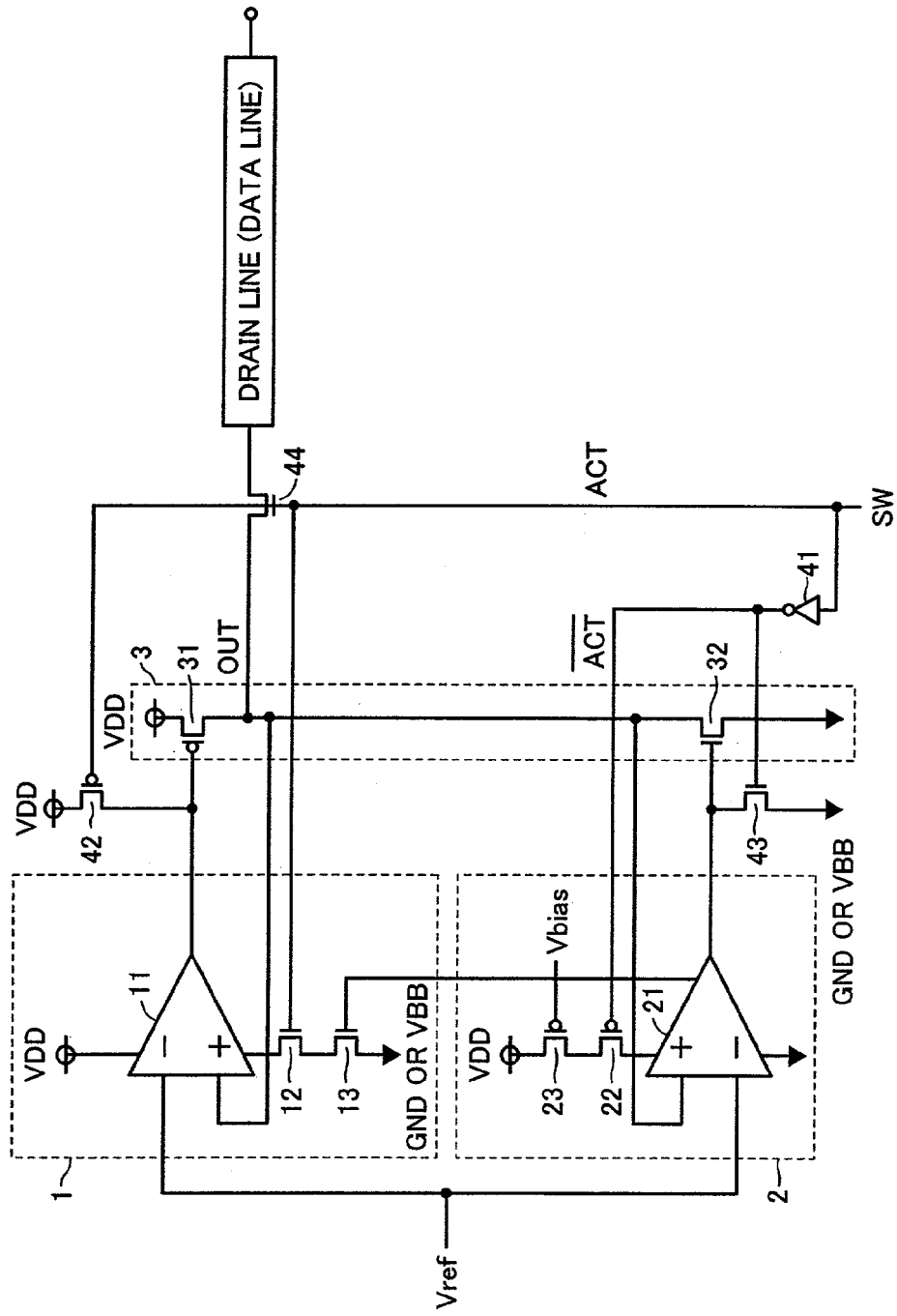
FIG. 2 is a circuit diagram showing a driving circuit including an analog buffer circuit according to a second embodiment of the present invention.

Referring to FIG. 2, a driving circuit according to a second embodiment of the present invention supplies the potential of a partial node of a differential amplifier 21 of a second differential circuit 2 to the gate of a through current control n-channel transistor 13 of a first differential circuit 1 while employing a bias potential Vbias for the gate potential of a through current control p-channel transistor 23 of the second differential circuit 2 dissimilarly to the aforementioned first embodiment. The remaining structure of the second embodiment is similar to that of the first embodiment.

According to the second embodiment, the node potential of the differential amplifier 21 of the second differential circuit 2 is employed as the gate potential of the through current control n-channel transistor 13 of the first differential circuit 1 as hereinabove described, whereby currents consumed by the first and second differential circuits 1 and 2 can be controlled independently of each other by providing only a single bias power source.

Figure 3:
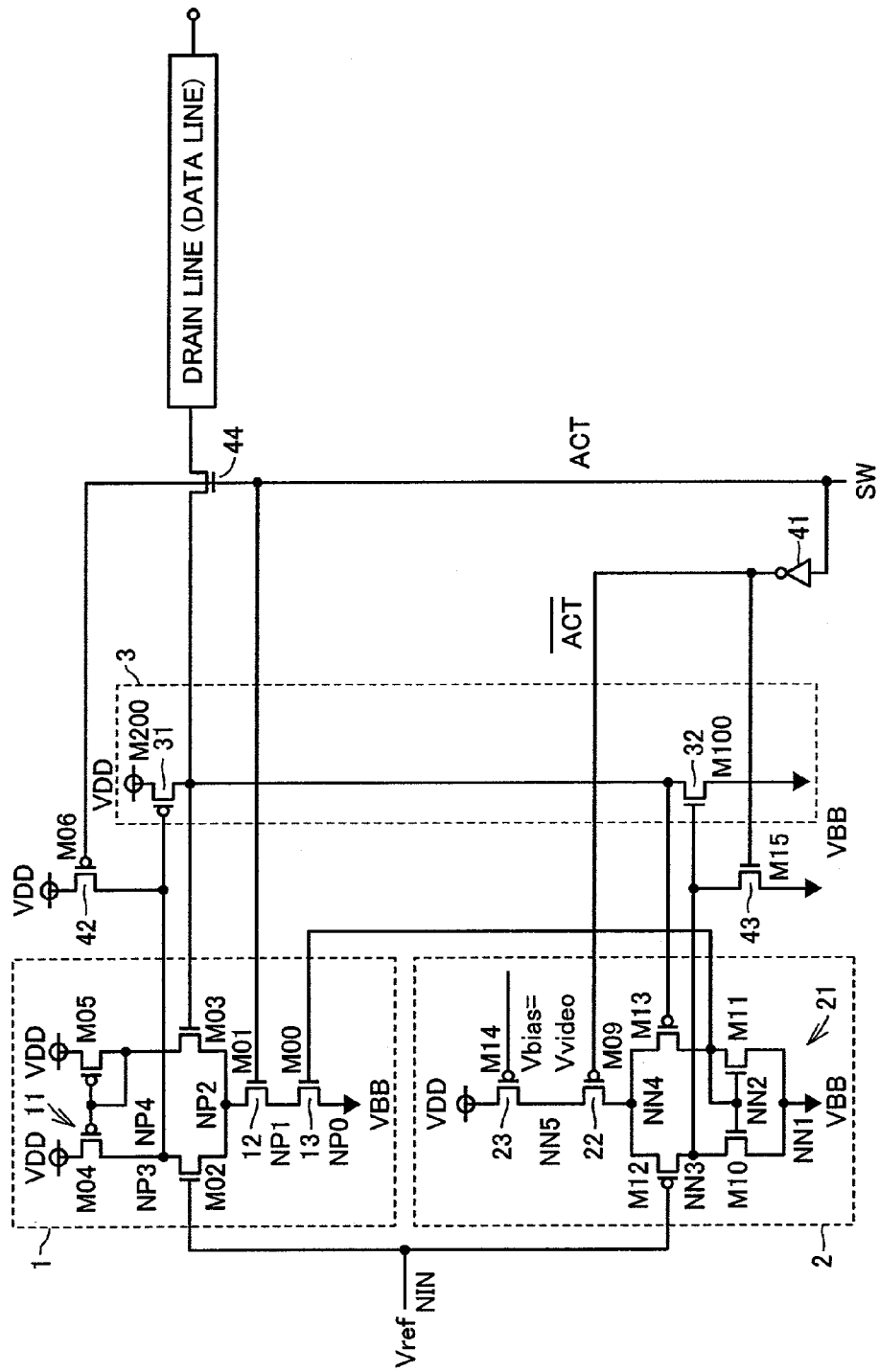
FIG. 3 is a circuit diagram showing exemplary internal structures of first and second differential circuits of the driving circuit according to the second embodiment shown in FIG. 2.

FIG. 3 is a circuit diagram showing exemplary internal structures of the first and second differential circuits 1 and 2 in the driving circuit according to the second embodiment shown in FIG. 2. Referring to FIG. 3, the potential of a node NN2 of the differential amplifier 21 of the second differential circuit 2 is supplied to the through current control n-channel transistor 13 of the first differential circuit 1 in this example. A video signal Vvideo is employed as the bias potential Vbias for the gate of the through current control p-channel transistor 23 of the second differential circuit 2. A negative potential VBB is employed as a low voltage side power source.

(Third Embodiment)

Figure 4:
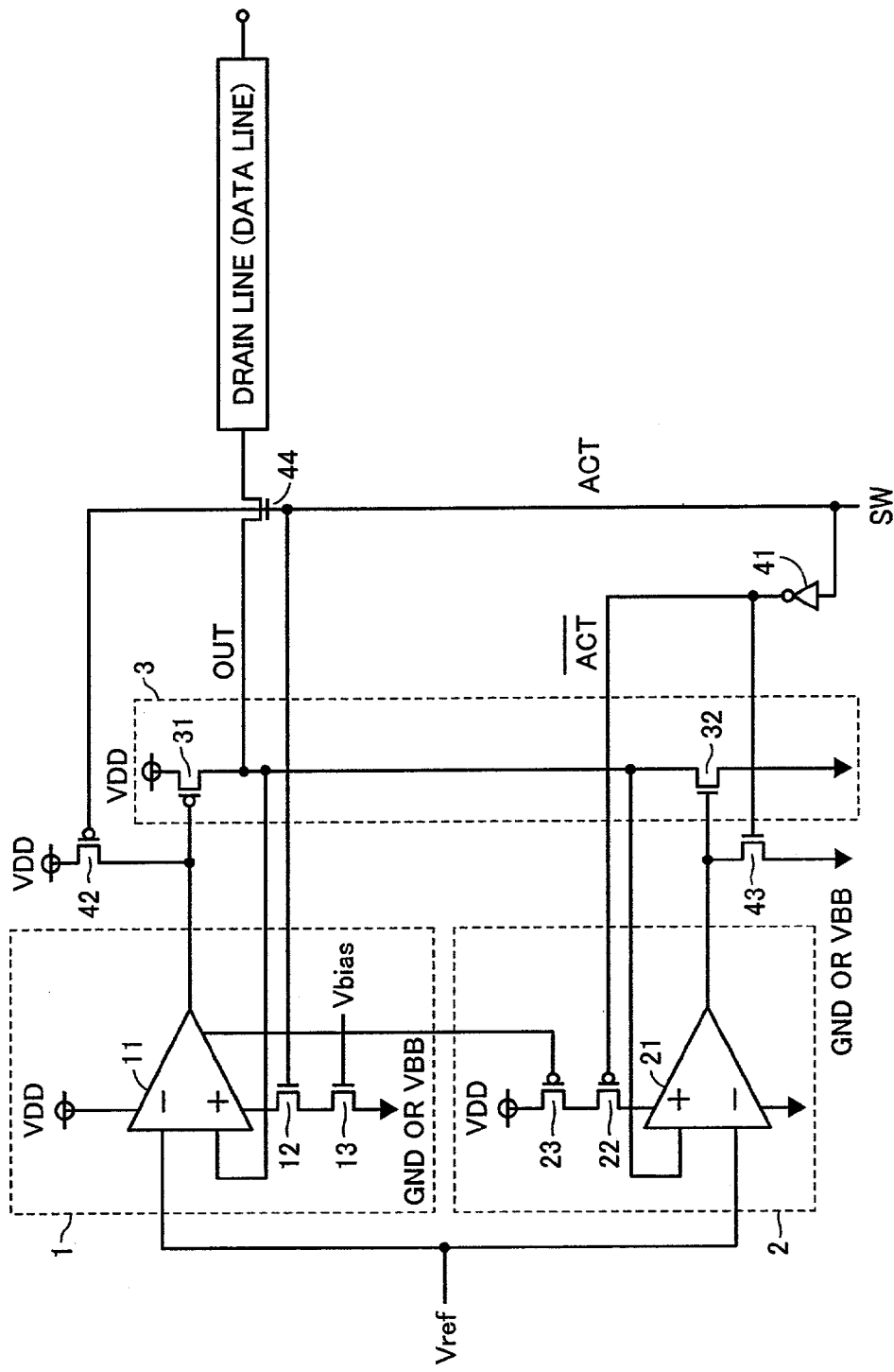
FIG. 4 is a circuit diagram showing a driving circuit including an analog buffer circuit according to a third embodiment of the present invention.

Referring to FIG. 4, a bias potential Vbias is connected to the gate of a through current control n-channel transistor 13 of a first differential circuit 1 while the potential of a prescribed node of a differential amplifier 11 of the first differential circuit 1 is supplied to the gate of a through current control p-channel transistor 23 of a second differential circuit 2 in a driving circuit according to a third embodiment of the present invention, dissimilarly to the second embodiment shown in FIG. 2. The remaining structure of the third embodiment is similar to that of the first embodiment.

According to the third embodiment, the prescribed bias power source Vbias is connected to the gate of the through current control n-channel transistor 13 of the first differential circuit 1 while the prescribed node of the differential amplifier 11 of the first differential circuit 1 is connected to the gate of the through current control p-channel transistor 23 of the second differential circuit 2 as described above, whereby currents consumed by the first and second differential circuits 2 can be controlled independently of each other by employing only a single bias power source.

Figure 5:
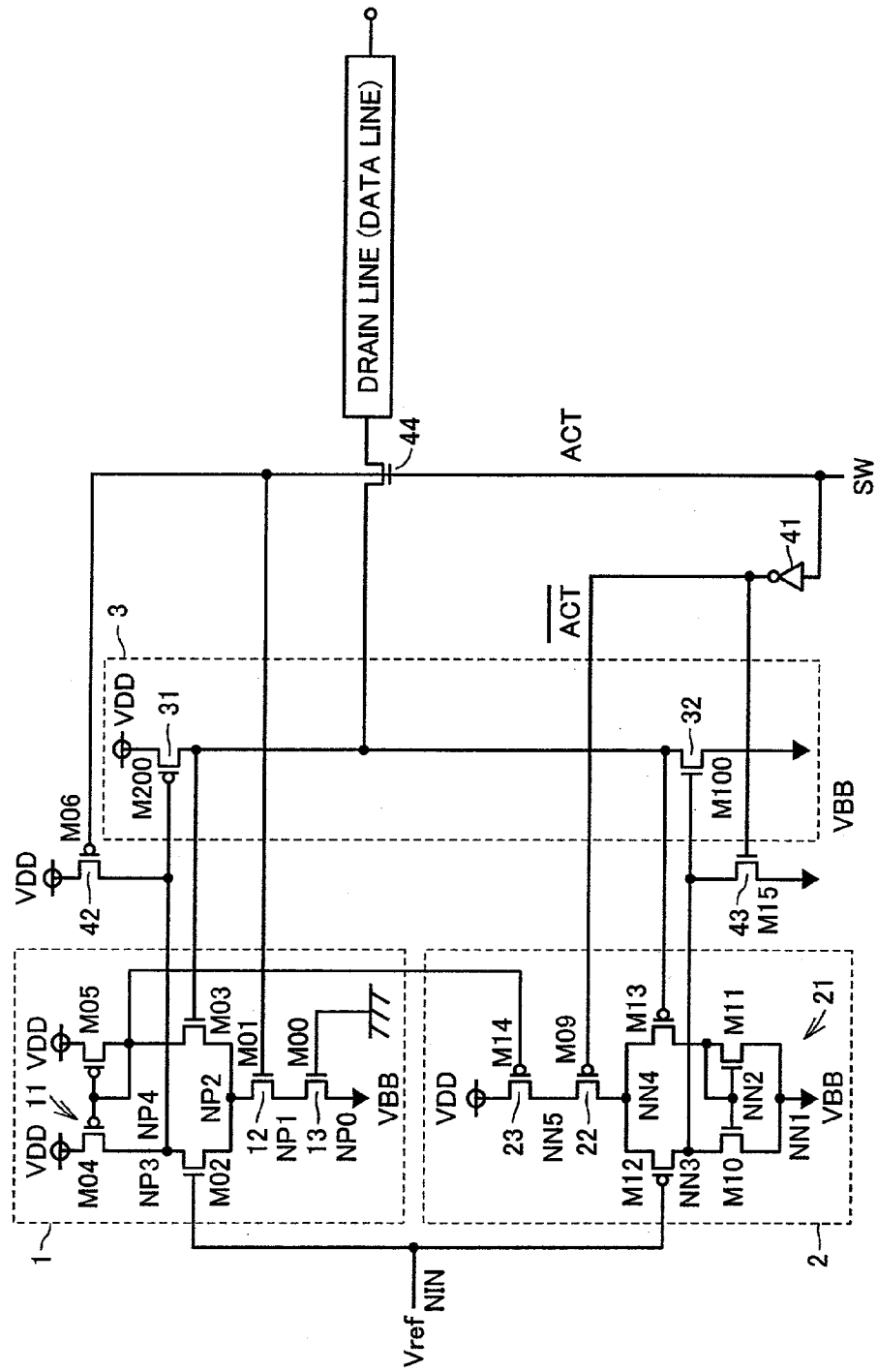
FIG. 5 is a circuit diagram showing exemplary internal structures of first and second differential circuits of the driving circuit according to the third embodiment shown in FIG. 4.

In an exemplary structure of the driving circuit according to the third embodiment shown in FIG. 5, a ground potential GND is employed as the bias potential Vbias for the through current control n-channel transistor 13 of the first differential circuit 1. Further, the potential of a node NP4 of the differential amplifier 11 of the first differential circuit 1 is employed as the gate potential of the through current control p-channel transistor 23 of the second differential circuit 2. In the exemplary structure of the driving circuit according to the third embodiment shown in FIG. 5, further, a positive power source VDD and a negative power source VBB are employed.

More specifically, the first differential circuit 1 based on a current mirror circuit includes the through current control n-channel transistor (M00) 13 having the gate connected with the bias potential (ground potential) and an n-channel transistor (M01) 12 having a switching function in the exemplary structure of the driving circuit according to the third embodiment shown in FIG. 5. Further, the second differential circuit 2 based on a current mirror circuit includes the through current control p-channel transistor (M14) 23 having the gate connected with the potential of the node NP4 of the differential amplifier 11 of the first differential circuit 1 and a p-channel transistor (M09) 22 having a switching function.

In the exemplary structure of the driving circuit according to the third embodiment shown in FIG. 5, potential ranges available for an n-channel transistor (M100) 32 and a p-channel transistor (M200) 31 forming a push-pull output circuit 3 are investigated.

The maximum output potential of the first differential circuit 1 is VDD+|VBB|−|Vtp|, and the maximum output potential of the second differential circuit 2 is VDD+|VBB|− Vth.

Thus, the elements limiting the available power supply ranges are only the threshold voltages of single transistors. The ranges available for the gate potentials are so wide that large operating margins can be taken also when the power supply voltage VDD is reduced, whereby the p-channel transistor 31 and the n-channel transistor 32 forming the push-pull output circuit 3 can be strongly and quickly turned on. Thus, reduction of the power supply voltage VDD can be implemented and the speed of data write operation in a data line can be increased.

In the exemplary structure of the driving circuit according to the third embodiment shown in FIG. 5, the first and second differential circuits 1 and 2 can control the gate potentials of the p-channel transistor 31 and the n-channel transistor 32 forming the push-pull output circuit 3 independently of each other, while the currents consumed by the first and second differential circuits 1 an 2 can be controlled through the n-channel transistor 13 and the p-channel transistor 23 independently of each other. When the quantities of the currents consumed by the first and second differential circuits 1 and 2 are increased for improving sensitivity for serving as compare circuits while reducing the quantity of current consumed by the push-pull output circuit 3 for suppressing drivability, therefore, the ON and OFF reaction rates of the p-channel transistor 31 and the n-channel transistor 32 forming the push-pull output circuit 3 can be improved, whereby the output value is quickly converged. Thus, the output value can be inhibited from overshooting or undershooting, whereby precise circuit characteristics can be obtained.

When the gate of the through current control n-channel transistor 13 of the first differential circuit 1 is set to the ground potential GND as in the exemplary structure of the driving circuit according to the third embodiment shown in FIG. 5, further, no bias power source may be newly provided. In this case, the currents consumed by the first and second differential circuits 1 and 2 can be controlled independently of each other without providing any bias power source.

(Fourth Embodiment)

Figure 6:
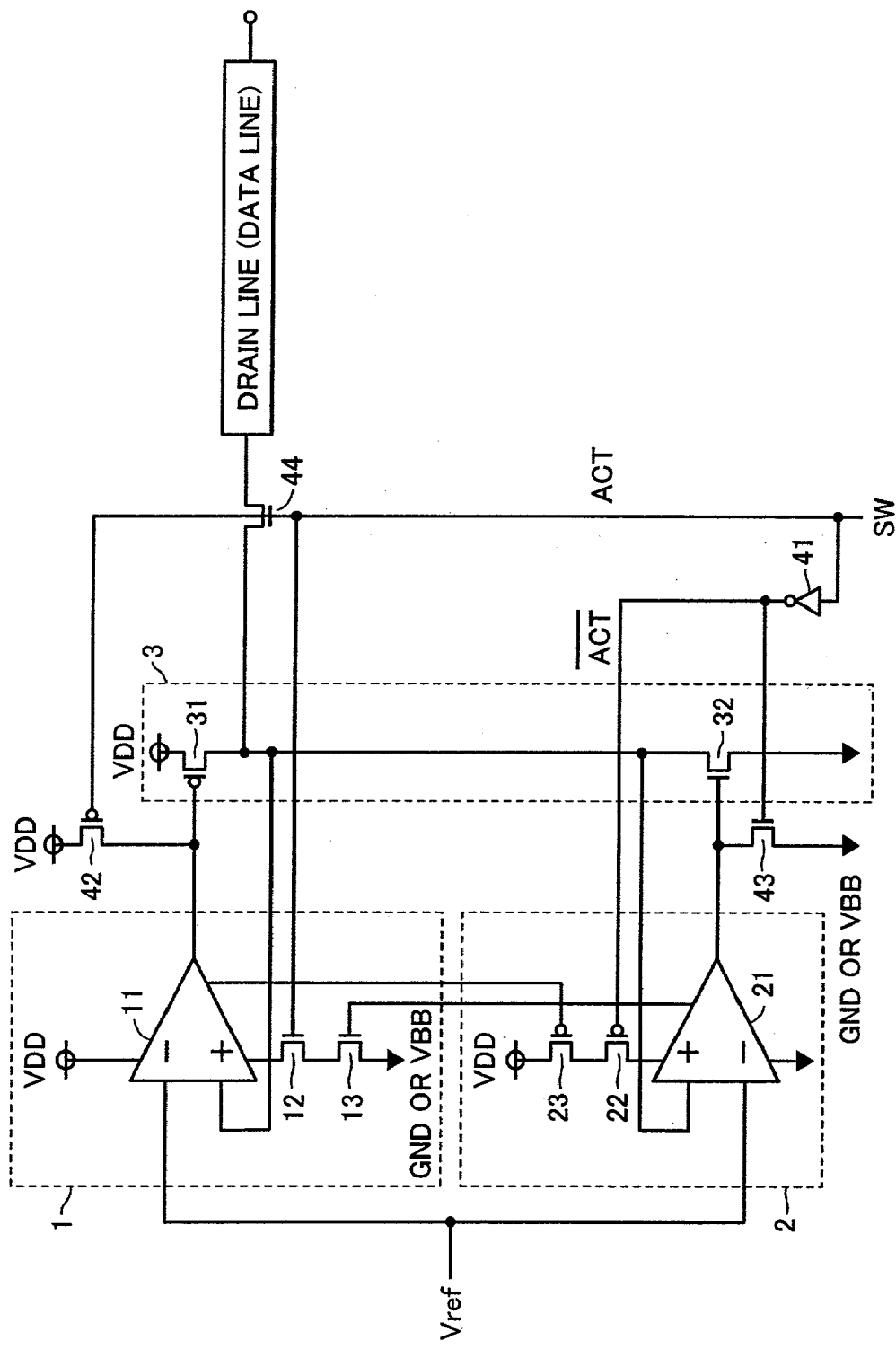
FIG. 6 is a circuit diagram showing a driving circuit including an analog buffer circuit according to a fourth embodiment of the present invention.
Figure 7:
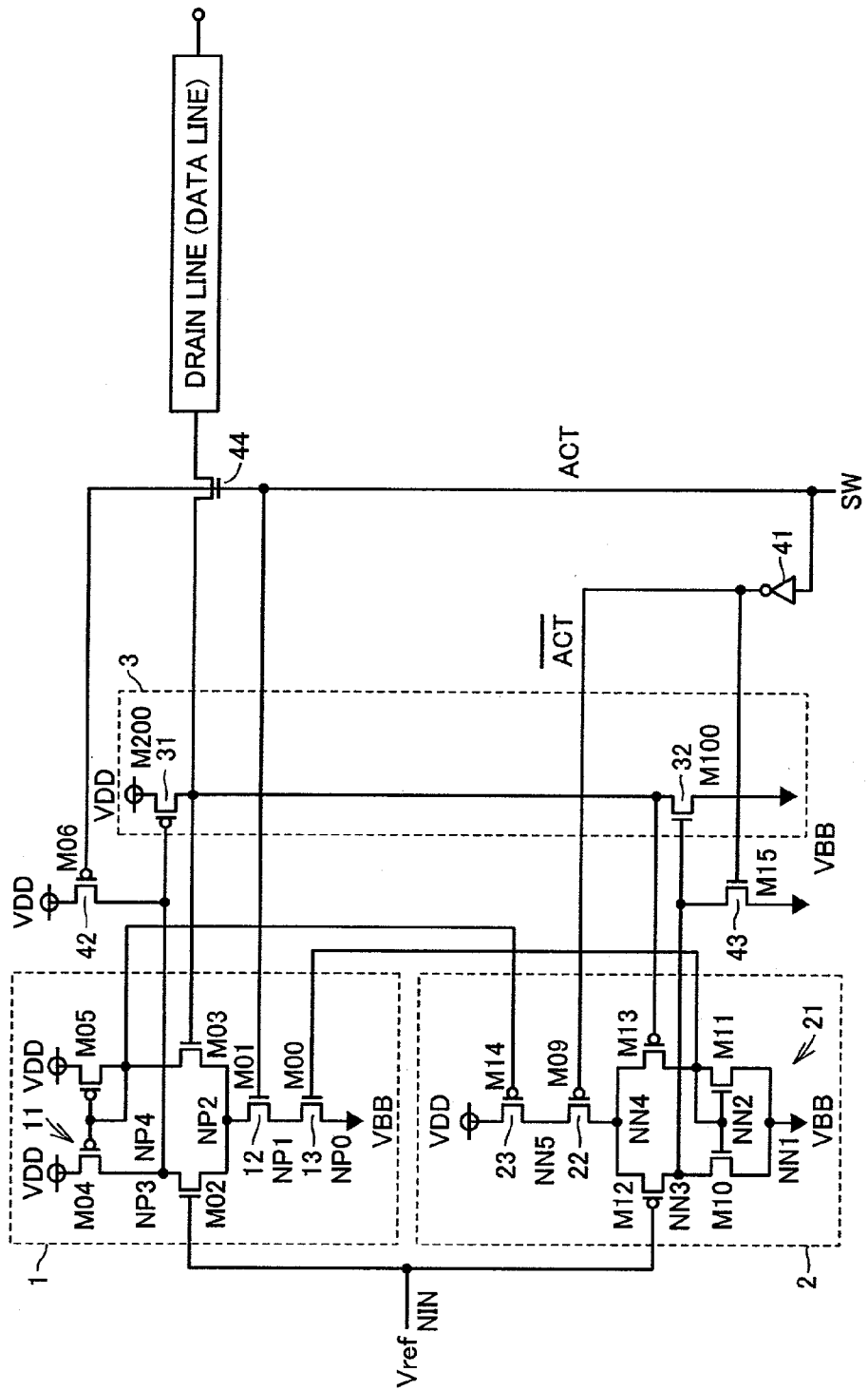
FIG. 7 is a circuit diagram showing exemplary internal structures of first and second differential circuits of the driving circuit according to the fourth embodiment shown in FIG. 6.

Referring to FIG. 6, a driving circuit according to a fourth embodiment of the present invention employs a prescribed node potential of a differential amplifier 21 of a second differential circuit 2 as the gate potential of a through current control n-channel transistor 13 of a first differential circuit 1 while employing a prescribed node potential of a differential amplifier 11 of the first differential circuit 1 as the gate potential of a through current control p-channel transistor 23 of the second differential circuit 2. In an exemplary internal structure shown in FIG. 7, the driving circuit employs the potential of a node NN2 of the differential amplifier 21 of the second differential circuit 2 as the gate potential of the through current control n-channel transistor 13 of the first differential circuit 1 while employing the potential of a node NP4 of the differential amplifier 11 of the first differential circuit 1 as the gate potential of the through current control p-channel transistor 23 of the second differential circuit 2.

As hereinabove described, the driving circuit according to the fourth embodiment employs the prescribed node potential of the differential amplifier 21 of the second differential circuit 2 as the gate potential of the through current control n-channel transistor 13 of the first differential circuit 1 while employing the prescribed node potential of the differential amplifier 11 of the first differential circuit 1 as the gate potential of the through current control p-channel transistor 23 of the second differential circuit 2, whereby currents consumed by the first and second differential circuits 1 and 2 can be controlled independently of each other without providing a new bias power source.

(Fifth Embodiment)

Figure 8:
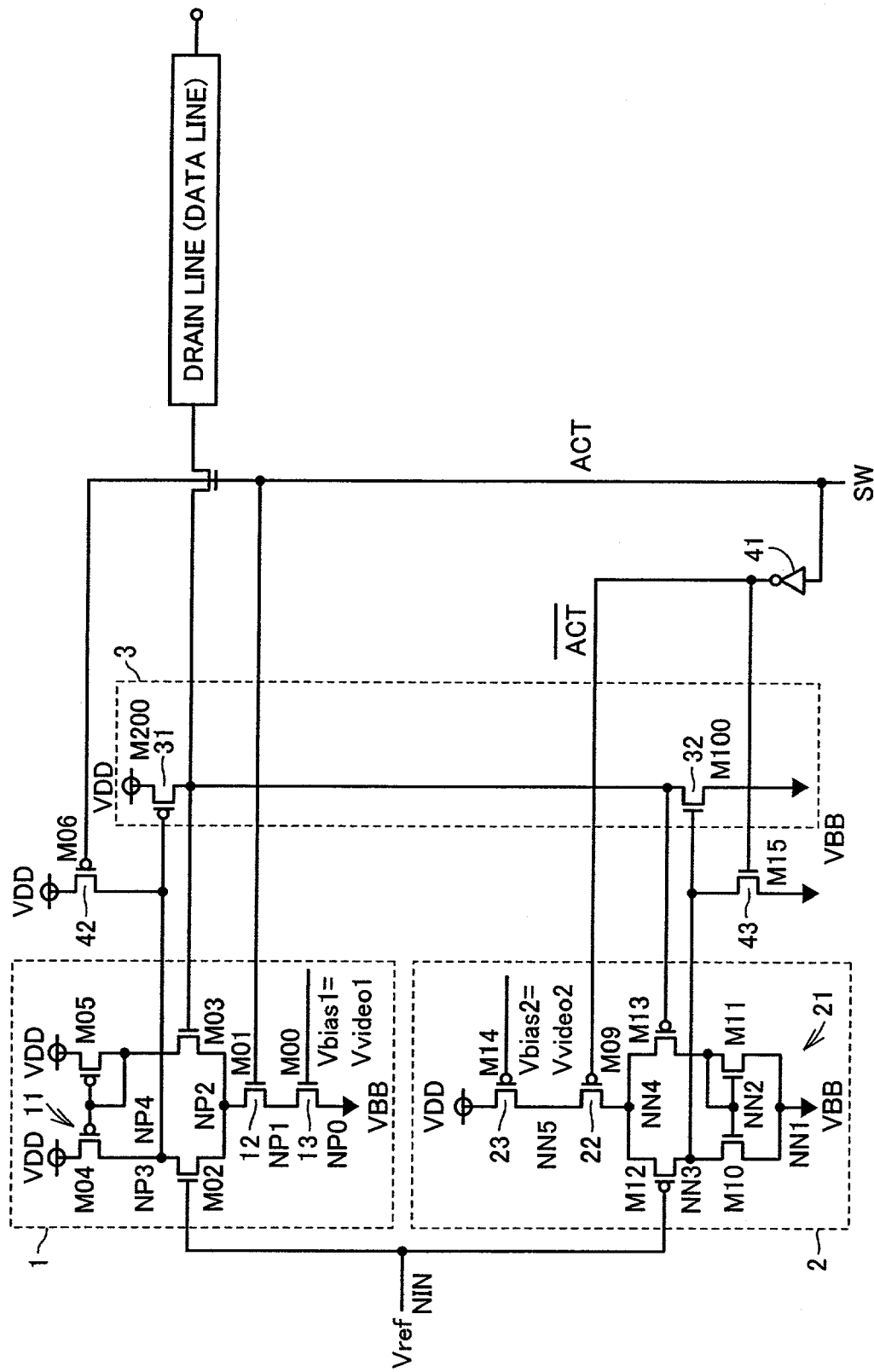
FIG. 8 is a circuit diagram showing the internal structure of a driving circuit including an analog buffer circuit according to a fifth embodiment of the present invention.

Referring to FIG. 8, a driving circuit according to a fifth embodiment of the present invention employs a bias potential Vbias1 (=Vvideo1) as the gate potential of a through current control n-channel transistor 13 of a first differential circuit 1 while employing a bias potential Vbias2 (=Vvideo2) as the gate potential of a through current control p-channel transistor 23 of a second differential circuit 2. The remaining structure of the fifth embodiment is similar to that of the first embodiment.

As hereinabove described, the driving circuit according to the fifth embodiment applies different video through current control n-channel transistor 13 of the first differential circuit 2 and the through current control p-channel transistor 23 of the second differential circuit 2 as the bias potentials respectively, whereby currents consumed by the first and second differential circuits 1 and 2 can be controlled independently of each other without providing a specific bias power source.

(Sixth Embodiment)

Figure 9:
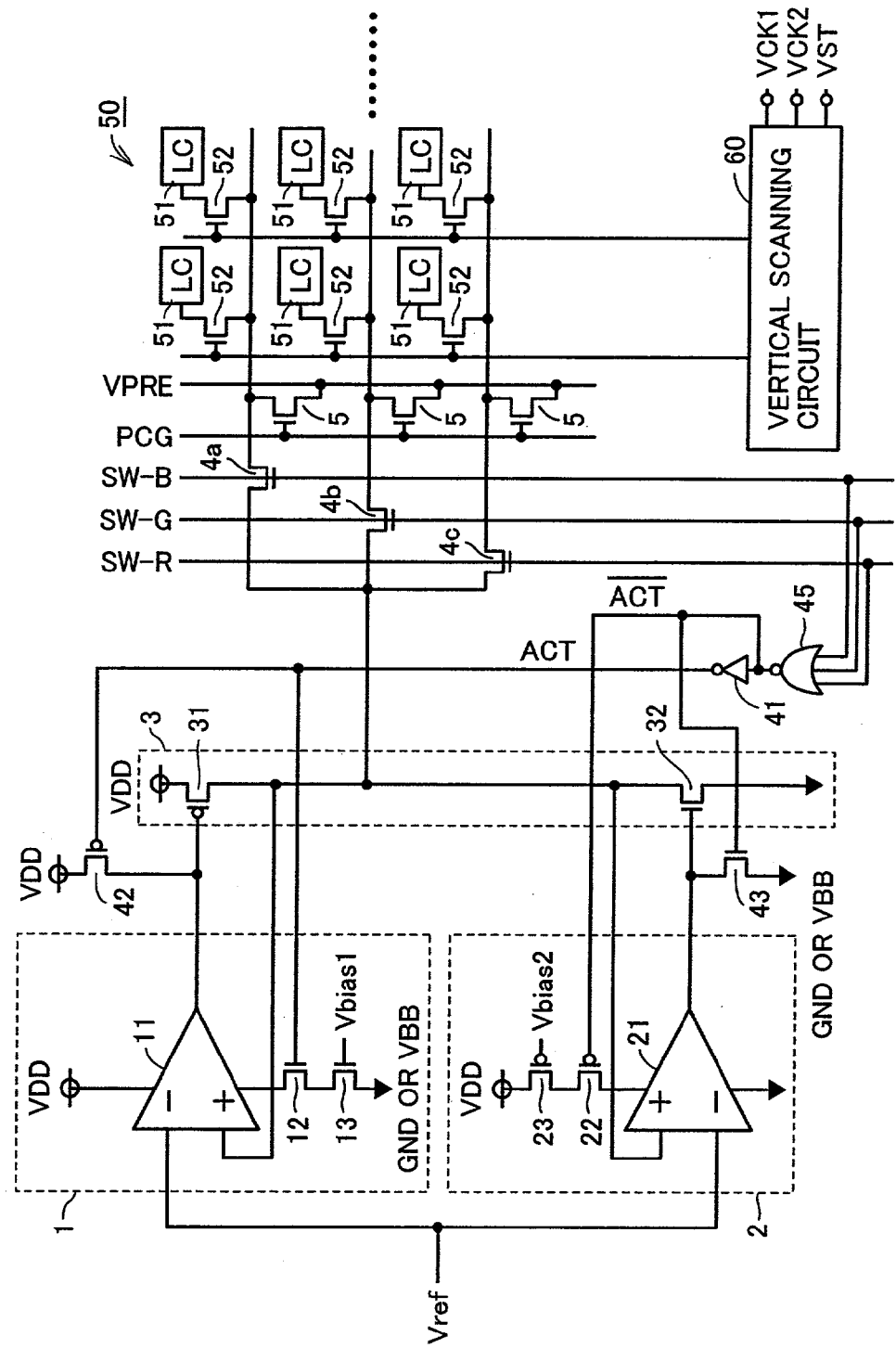
FIG. 9 is a circuit diagram showing a driving circuit including an analog buffer circuit according to a sixth embodiment of the present invention.
Figure 10:
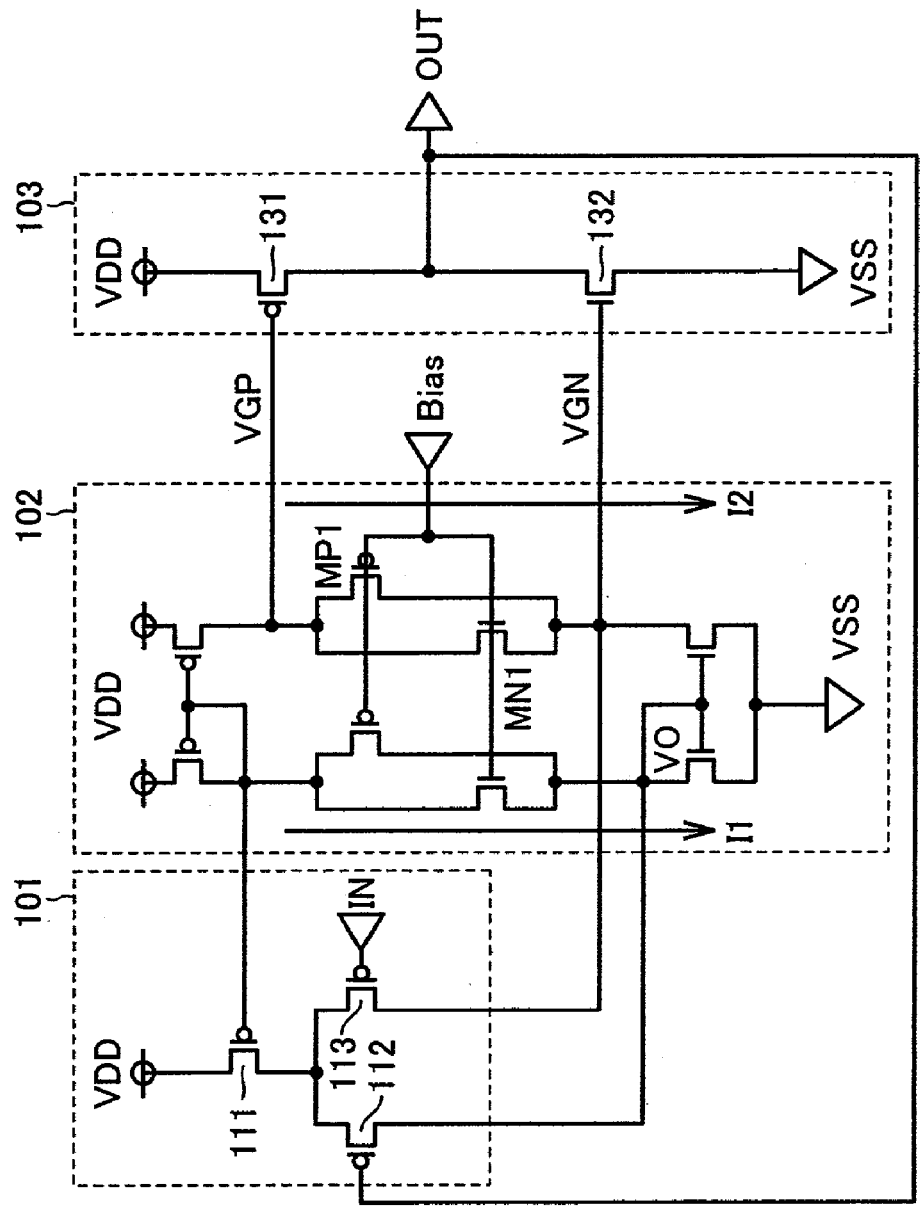
FIG. 10 is a circuit diagram showing a conventional push-pull differential amplification circuit.

Referring to FIG. 9, an analog buffer circuit consists of first and second differential circuits 1 and 2 and a push-pull output circuit 3 every three data lines according to a sixth embodiment of the present invention. The analog buffer circuit according to the sixth embodiment drives three data lines of red (R), green (G) and blue (B) in a time-divisional manner.

A pixel part 50 includes liquid crystals 51 and switching transistors 52, with arrangement of write control switching transistors 4a, 4b and 4c and transistors 5 turned by a signal PCG. The analog buffer circuit is further provided with an inverter circuit 41 and a NOR circuit 45, in order to generate start signals ACT and /ACT for the analog buffer circuit.

In specific operation of the analog buffer circuit according to the sixth embodiment, data write signals SW-R, SW-G and SW-B are sequentially turned on thereby sequentially turning on the switching transistors 4c, 4b and 4a. At the same time, data write signals SW2-R, SW2-G and SW2-B sequentially go high, whereby an output (the signal /ACT) of the NOR circuit 45 sequentially goes low and an output (the signal ACT) of the inverter circuit 41 sequentially goes high for operating the first and second differential circuits 1 and 2 and the push-pull output circuit 3.

The analog buffer circuit according to the sixth embodiment is provided every three data lines as hereinabove described, whereby the layout area of the analog buffer circuit as well as the number of elements can be reduced. Thus, power consumption can be further reduced.

Although the present invention has been described and illustrated in detail, it is clearly understood that the same is by way of illustration and example only and is not to be taken by way of limitation, the spirit and scope of the present invention being limited only by the terms of the appended claims.

In each of the aforementioned embodiments, for example, the power supply potential VDD may alternatively be employed as the bias potential for the through current control n-channel transistor 13 of the first differential circuit 1 while employing the negative potential VBB as the gate potential for the through current control p-channel transistor 23 of the second differential circuit 2. Further alternatively, the potential of the same video data signal may be employed as the gate potentials of the n-channel transistor 13 of the first differential circuit 1 and the p-channel transistor 23 of the second differential circuit 2.

While each of the above embodiments has been described with reference to a display consisting of a liquid crystal display (LCD), the present invention is not restricted to this but is also applicable to another display such as an EL display. Further, the present invention is not restricted to a display but is also applicable to another driving circuit employing a buffer circuit.

What is claimed is:

1. A driving circuit comprising:
a first differential circuit, connected between a first voltage source and a second voltage source, receiving a prescribed reference voltage and including a first through current control transistor;
a second differential circuit, connected between said first voltage source and said second voltage source, receiving said prescribed reference voltage and including a second through current control transistor; and
an output circuit including a first conductivity type first output transistor having a gate supplied with an output of said first differential circuit and a second conductivity type second output transistor having a gate supplied with an output of said second differential circuit; wherein
a first potential is supplied to the gate of said first through current control transistor of said first differential circuit while a second potential is supplied to the gate of said second through current control transistor of said second differential circuit; and
the potential of a prescribed node of said second differential circuit is supplied to the gate of said first through current control transistor of said first differential circuit, and
a prescribed bias potential is supplied to the gate of said second through current control transistor of said second differential circuit.

2. A driving circuit comprising:
a first differential circuit, connected between a first voltage source and a second voltage source, receiving a prescribed reference voltage and including a first through current control transistor;
a second differential circuit, connected between said first voltage source and said second voltage source, receiving said prescribed reference voltage and including a second through current control transistor; and
an output circuit including a first conductivity type first output transistor having a gate supplied with an output of said first differential circuit and a second conductivity type second output transistor having a gate supplied with an output of said second differential circuit; wherein
a first potential is supplied to the gate of said first through current control transistor of said first differential circuit while a second potential is supplied to the gate of said second through current control transistor of said second differential circuit; and
a prescribed bias potential is supplied to the gate of said first through current control transistor of said first differential circuit, and
the potential of a prescribed node of said first differential circuit is supplied to the gate of said second through current control transistor of said second differential circuit.

3. The driving circuit according to claim 2, wherein said bias potential supplied to the gate of said first through current control transistor of said first differential circuit is a ground potential.

4. A driving circuit comprising:
a first differential circuit, connected between a first voltage source and a second voltage source, receiving a prescribed reference voltage and including a first through current control transistor;
a second differential circuit, connected between said first voltage source and said second voltage source, receiving said prescribed reference voltage and including a second through current control transistor; and
an output circuit including a first conductivity type first output transistor having a gate supplied with an output of said first differential circuit and a second conductivity type second output transistor having a gate supplied with an output of said second differential circuit; wherein
a first potential is supplied to the gate of said first through current control transistor of said first differential circuit while a second potential is supplied to the gate of said second through current control transistor of said second differential circuit; and
the potential of a prescribed node of said second differential circuit is supplied to the gate of said first through current control transistor of said first differential circuit, and the potential of a prescribed node of said first differential circuit is supplied to the gate of said second through current control transistor of said second differential circuit.

5. A driving circuit comprising:
a first differential circuit, connected between a first voltage source and a second voltage source, receiving a prescribed reference voltage and including a first through current control transistor;
a second differential circuit, connected between said first voltage source and said second voltage source, receiving said prescribed reference voltage and including a second through current control transistor; and
an output circuit including a first conductivity type first output transistor having a gate supplied with an output of said first differential circuit and a second conductivity type second output transistor having a gate supplied with an output of said second differential circuit; wherein
a first potential is supplied to the gate of said first through current control transistor of said first differential circuit while a second potential is supplied to the gate of said second through current control transistor of said second differential circuit;
a first bias potential is supplied to the gate of said first through current control transistor of said first differential circuit, and
a second bias potential is supplied to the gate of said second through current control transistor of said second differential circuit; and
said first bias potential includes a first video signal potential, and
said second bias potential includes a second video signal potential.

6. The driving circuit according to claim 5, wherein said first video signal potential and said second video signal potential include the same video signal potential.

7. A display comprising a driving circuit and a pixel part connected to a data line, wherein
said driving circuit includes:
a first differential circuit, connected between a first voltage source and a second voltage source, receiving a prescribed reference voltage and including a first through current control transistor,
a second differential circuit, connected between said first voltage source and said second voltage source, receiving said prescribed reference voltage and including a second through current control transistor, and
an output circuit including a first conductivity type first output transistor having a gate supplied with an output of said first differential circuit and a second conductivity type second output transistor having a gate supplied with an output of said second differential circuit, and
a first potential is supplied to the gate of said first through current control transistor of said first differential circuit while a second potential is supplied to the gate of said second through current control transistor of said second differential circuit; wherein
the potential of a prescribed node of said second differential circuit is supplied to the gate of said first through current control transistor of said first differential circuit, and
a prescribed bias potential is supplied to the gate of said second through current control transistor of said second differential circuit.

8. A display comprising a driving circuit and a pixel part connected to a data line, wherein
said driving circuit includes:
a first differential circuit, connected between a first voltage source and a second voltage source, receiving a prescribed reference voltage and including a first through current control transistor,
a second differential circuit, connected between said first voltage source and said second voltage source, receiving said prescribed reference voltage and including a second through current control transistor, and
an output circuit including a first conductivity type first output transistor having a gate supplied with an output of said first differential circuit and a second conductivity type second output transistor having a gate supplied with an output of said second differential circuit, and
a first potential is supplied to the gate of said first through current control transistor of said first differential circuit while a second potential is supplied to the gate of said second through current control transistor of said second differential circuit; wherein
a prescribed bias potential is supplied to the gate of said first through current control transistor of said first differential circuit, and
the potential of a prescribed node of said first differential circuit is supplied to the gate of said second through current control transistor of said second differential circuit.

9. A display comprising a driving circuit and a pixel part connected to a data line, wherein
said driving circuit includes:
a first differential circuit, connected between a first voltage source and a second voltage source, receiving a prescribed reference voltage and including a first through current control transistor,
a second differential circuit, connected between said first voltage source and said second voltage source, receiving said prescribed reference voltage and including a second through current control transistor, and
an output circuit including a first conductivity type first output transistor having a gate supplied with an output of said first differential circuit and a second conductivity type second output transistor having a gate supplied with an output of said second differential circuit, and
a first potential is supplied to the gate of said first through current control transistor of said first differential circuit while a second potential is supplied to the gate of said second through current control transistor of said second differential circuit; wherein
the potential of a prescribed node of said second differential circuit is supplied to the gate of said first through current control transistor of said first differential circuit, and
the potential of a prescribed node of said first differential circuit is supplied to the gate of said second through current control transistor of said second differential circuit.

* * * * *

UNITED STATES PATENT AND TRADEMARK OFFICE
CERTIFICATE OF CORRECTION

| | |
|---|---|
| PATENT NO. | : 7,019,729 B2 |
| APPLICATION NO. | : 10/151944 |
| DATED | : March 28, 2006 |
| INVENTOR(S) | : Shoichiro Matsumoto |

It is certified that error appears in the above-identified patent and that said Letters Patent is hereby corrected as shown below:

On the title page of the Letters Patent, Col. 1
Under section "(73) Assignee", change "Eleectric" to -- Electric --

Signed and Sealed this

Eleventh Day of July, 2006

JON W. DUDAS
*Director of the United States Patent and Trademark Office*